United States Patent
Wang et al.

(10) Patent No.: US 8,786,017 B2
(45) Date of Patent: *Jul. 22, 2014

(54) STRAINED GE-ON-INSULATOR STRUCTURE AND METHOD FOR FORMING THE SAME

(75) Inventors: Jing Wang, Beijing (CN); Jun Xu, Beijing (CN); Lei Guo, Beijing (CN)

(73) Assignee: Tsinghua University (CN)

( * ) Notice: Subject to any disclaimer, the term of this patent is extended or adjusted under 35 U.S.C. 154(b) by 201 days.

This patent is subject to a terminal disclaimer.

(21) Appl. No.: 13/263,222

(22) PCT Filed: Aug. 25, 2011

(86) PCT No.: PCT/CN2011/078946
§ 371 (c)(1),
(2), (4) Date: Oct. 6, 2011

(87) PCT Pub. No.: WO2012/119418
PCT Pub. Date: Sep. 13, 2012

(65) Prior Publication Data
US 2012/0228707 A1    Sep. 13, 2012

(30) Foreign Application Priority Data

Mar. 10, 2011  (CN) .......................... 2011 1 0058127
Mar. 10, 2011  (CN) .......................... 2011 1 0058128
Mar. 10, 2011  (CN) .......................... 2011 1 0058370

(51) Int. Cl.
*H01L 27/12*  (2006.01)

(52) U.S. Cl.
USPC ............... 257/347; 257/192; 257/E21.112; 257/E21.409; 438/151; 438/285

(58) Field of Classification Search
CPC ............ H01L 29/7846; H01L 29/78684
See application file for complete search history.

(56) References Cited

U.S. PATENT DOCUMENTS 7,164,163 B2 *  1/2007  Chen et al. .................... 257/288
7,221,006 B2    5/2007  Orlowski et al.
(Continued)

FOREIGN PATENT DOCUMENTS

CN          1787230 A     6/2006
CN        101009203 A     8/2007
(Continued)

OTHER PUBLICATIONS

Fang, Y.Y. Perfectly Tetragonal, Tensile-Strained Ge on Ge1-ySny buffered Si(100). Applied Physics Letters, vol. 90. (Feb. 7, 2007), pp. 061915.

(Continued)

*Primary Examiner* — William F Kraig
*Assistant Examiner* — Pavel Ivanov
(74) *Attorney, Agent, or Firm* — Lerner, David, Littenberg, Krumholz & Mentlik, LLP

(57) ABSTRACT

A strained Ge-on-insulator structure is provided, comprising: a silicon substrate, in which an oxide insulating layer is formed on a surface of the silicon substrate; a Ge layer formed on the oxide insulating layer, in which a first passivation layer is formed between the Ge layer and the oxide insulating layer; a gate stack formed on the Ge layer, a channel region formed below the gate stack, and a source and a drain formed on sides of the channel region; and a plurality of shallow trench isolation structures extending into the silicon substrate and filled with an insulating dielectric material to produce a strain in the channel region. Further, a method for forming the strained Ge-on-insulator structure is also provided.

6 Claims, 4 Drawing Sheets

(56) References Cited

U.S. PATENT DOCUMENTS

| | | |
|---|---|---|
| 7,229,898 B2 | 6/2007 | Bourdelle et al. |
| 7,494,852 B2 | 2/2009 | Bedell et al. |
| 7,897,493 B2 | 3/2011 | Fiorenza et al. |
| 7,986,016 B2 | 7/2011 | Kamata et al. |
| 8,063,413 B2 | 11/2011 | Bai et al. |
| 2003/0089950 A1 | 5/2003 | Kuech et al. |
| 2004/0069991 A1 | 4/2004 | Dunn et al. |
| 2006/0237746 A1 | 10/2006 | Orlowski et al. |
| 2007/0170541 A1* | 7/2007 | Chui et al. ............ 257/506 |
| 2008/0135873 A1* | 6/2008 | Fiorenza et al. ........ 257/190 |
| 2008/0268615 A1* | 10/2008 | Allibert et al. ........ 438/455 |
| 2009/0114902 A1* | 5/2009 | Bai et al. ................ 257/18 |
| 2009/0261349 A1* | 10/2009 | Lee et al. ................ 257/77 |
| 2010/0065886 A1* | 3/2010 | Kamata et al. ........ 257/192 |

FOREIGN PATENT DOCUMENTS

| | | |
|---|---|---|
| CN | 101273438 A | 9/2008 |
| CN | 101295647 A | 10/2008 |
| CN | 101359685 A | 2/2009 |
| CN | 101882624 A | 11/2010 |

OTHER PUBLICATIONS

International Search Report for Application No. PCT/CN2011/078944 dated Dec. 15, 2011.

International Search Report for Application No. PCT/CN2011/078946 dated Dec. 15, 2011.

International Search Report for Application No. PCT/CN2011/078948 dated Dec. 15, 2011.

* cited by examiner

STRAINED GE-ON-INSULATOR STRUCTURE AND METHOD FOR FORMING THE SAME

CROSS-REFERENCE TO RELATED APPLICATIONS

The present application is a national phase entry under 35 U.S.C. §371 of International Application No. PCT/CN2011/078946 filed Aug. 25, 2011, which claims priority from Chinese Patent Application Nos. 201110058127.5, filed Mar. 10, 2011; 201110058128.X, filed Mar. 10, 2011; and 201110058370.7, filed Mar. 10, 2011, all of which are incorporated herein by reference.

FIELD

The present disclosure relates to a semiconductor manufacture field, and more particularly to a strained GeOI (Ge-on-insulator) structure and a method for forming the same.

BACKGROUND

For a long time, a feature size of a metal-oxide-semiconductor field-effect transistor (MOSFET) is scaled down according to Moore's law, and a working speed of the MOSFET is faster and faster. However, physical and technical limits of Si materials have been reached. Therefore, in order to improve a performance of the MOSFET, various methods have been proposed, and consequently a More-than-Moore era has come. Among them, an effective technology is a high-mobility channel engineering based on heterogeneous materials, particularly, high-carrier-mobility materials such as Si-based Ge materials. For example, one high-hole-mobility Si-based Ge material is a GeOI structure formed by directly bonding Ge and a Si wafer having a $SiO_2$ insulating layer, which has good application perspective.

A conventional GeOI structure is formed by directly bonding Ge and insulation oxides such as $SiO_2$, or formed by forming $GeO_2$ on Ge and then bonding Ge and a silicon wafer. The defects lie in that, if a Ge layer is directly formed on an insulation oxide substrate, because an interface between the Ge materials and the insulation oxides is poor, particularly, an interface state density is very high, serious carrier scattering and leakage may be caused, thus influencing a performance of a device. In addition, because the Ge layer is very thin, a strain in the Ge layer may be difficult to produce. However, a suitable strain in the Ge layer may improve the performance of the device effectively.

SUMMARY

The present disclosure is aimed to solve at least one of the above mentioned technical problems, particularly a defect of poor interface state between Ge and an oxide insulator in a conventional GeOI structure and a defect of being difficult to produce a strain in a Ge layer.

According to an aspect of the present disclosure, a strained GeOI structure is provided, comprising: a silicon substrate, wherein an oxide insulating layer is formed on a surface of the silicon substrate; a Ge layer formed on the oxide insulating layer, in which a first passivation layer is formed between the Ge layer and the oxide insulating layer; a gate stack formed on the Ge layer, a channel region formed below the gate stack, and a source and a drain formed on sides of the channel region; and a plurality of shallow trench isolation structures extending into the silicon substrate and filled with an insulating dielectric material to produce a strain in the channel region. Therefore, the shallow trench isolation structures may be deep and a channel strain is further improved.

In one embodiment, the first passivation layer is a strontium germanide layer, a barium germanide layer, or a stannum germanide layer.

In one embodiment, the strained GeOI structure further comprises: a second passivation layer formed on the Ge layer, in which the second passivation layer is a strontium germanide layer, a barium germanide layer, or a stannum germanide layer.

In one embodiment, the insulating dielectric material is silicon nitride.

In one embodiment, the strained GeOI structure further comprises: a SiN stress cap layer covering the gate stack to produce a strain in the channel region.

In one embodiment, the source and the drain are a $Si_xGe_{1-x}$:C source and a $Si_xGe_{1-x}$:C drain respectively to produce a corresponding strain in the channel region, in which x is within a range from 0 to 1 and a content of C is within a range from 0 to 7.5%.

According to another aspect of the present disclosure, a method for forming a strained GeOI structure is provided, comprising steps of: forming a Ge layer on a first substrate; treating a first surface of the Ge layer to form a first passivation layer; bonding the first passivation layer with a silicon substrate, in which an oxide insulating layer is formed on a surface of the silicon substrate; removing the first substrate; forming a gate stack on the Ge layer, forming a channel region below the gate stack, and forming a source and a drain on sides of the channel region respectively; etching into the silicon substrate to form a plurality of shallow trench isolation structures; and filling an insulating dielectric material in the plurality of shallow trench isolation structures to produce a strain in the channel region. Therefore, the shallow trench isolation structures may be deep and a channel strain is further improved.

In one embodiment, the first passivation layer is a strontium germanide layer, a barium germanide layer, or a stannum germanide layer.

In one embodiment, after removing the first substrate, the method further comprises: treating a second surface of the Ge layer to form a second passivation layer, in which the second passivation layer is a strontium germanide layer, a barium germanide layer, or a stannum germanide layer.

In one embodiment, the first passivation layer is bonded with the oxide insulating layer.

In one embodiment, the insulating dielectric material is silicon nitride.

In one embodiment, the method further comprises: doping the source and the drain to form a $Si_xGe_{1-x}$:C source and a $Si_xGe_{1-x}$:C drain respectively to produce a corresponding strain in the channel region, in which x is within a range from 0 to 1 and a content of C is within a range from 0 to 7.5%.

In one embodiment, the method further comprises: forming a SiN stress cap layer covering the gate stack to produce a strain in the channel region.

According to an embodiment of the present disclosure, the first passivation layer may alleviate an interface state problem between Ge materials and an insulation oxide, thus reducing a leakage and a carrier scattering at the interface. Moreover, because the strontium germanide layer, the barium germanide layer or the stannum germanide layer is a semiconductor layer, the interface state problem between Ge materials and the insulation oxide may be alleviated so as to reduce the leakage and the carrier scattering at the interface, and the carrier mobility of the Ge materials may not be reduced largely. In addition, the plurality of STI structures filled with the insulating dielectric material may cause a desired strain to be produced in the channel region below the gate stack, thus further improving the performance of the device.

Furthermore, the SiN stress cap layer may cause a strain to be produced in the channel region, thus improving the performance of the device. When the side walls are 0.5-0.8 times as high as the gate electrode, a stress in the SiN stress cap layer may be transferred to the channel region effectively, thus further improving the performance of the device.

Moreover, according to an embodiment of the present disclosure, the Ge channel device comprising the $Si_xGe_{1-x}$:C source and the $Si_xGe_{1-x}$:C drain may be simple in structure and easy to form, and a diffusion of impurities (for example, B or P) in the $Si_xGe_{1-x}$:C source and the $Si_xGe_{1-x}$:C drain may be much weaker than that in the Ge layer, thus obtaining high doping concentrations in the $Si_xGe_{1-x}$:C source and the $Si_xGe_{1-x}$:C drain and improving the performance of the device. In addition, the $Si_xGe_{1-x}$:C source and the $Si_xGe_{1-x}$:C drain may cause a tensile strain to be produced in the channel region, thus improving the performance of the Ge channel device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
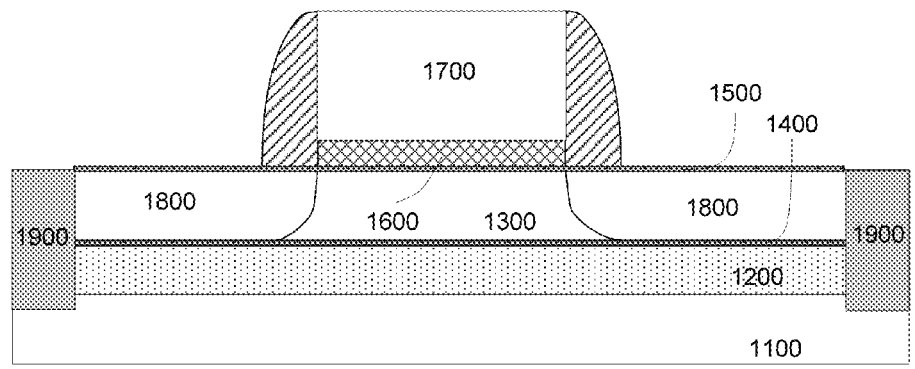
FIG. 1 is a cross-sectional view of a strained GeOI structure according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

FIG. 1 is a cross-sectional view of a strained GeOI structure according to an embodiment of the present disclosure. The strained GeOI structure comprises: a silicon substrate 1100, on a surface of which an oxide insulating layer 1200 is formed; and a Ge layer 1300 formed on the oxide insulating layer 1200, in which a first passivation layer 1400 is formed between the Ge layer 1300 and the oxide insulating layer 1200. In some embodiments, the first passivation layer 1400 is a strontium germanide ($GeSr_x$) layer or a barium germanide ($GeBa_x$) layer formed by treating a first surface of the Ge layer 1300 using strontium or barium. In other embodiments, the first passivation layer 1400 may also be a stannum germanide layer. In one embodiment, the oxide insulating layer 1200 is a $SiO_2$ insulating layer. Because the strontium germanide layer, the barium germanide layer or the stannum germanide layer is a semiconductor layer, an interface state problem between Ge materials and an insulation oxide may be alleviated so as to reduce a leakage and a carrier scattering at the interface, and a carrier mobility of the Ge materials may not be reduced largely. In one embodiment, in order to form a strained Ge channel device, the strained GeOI structure further comprises a plurality of STI (shallow trench isolation) structures 1900. The plurality of STI structures 1900 extend into the silicon substrate 1100, and the STI structures 1900 are filled with an insulating dielectric material to produce a strain in a channel region. In one embodiment, the insulating dielectric material is silicon nitride. However, it should be noted that, the silicon nitride described herein is not limited to SiN with a molar ratio of 1:1. Particularly, a content of each component in the silicon nitride may be adjusted to adjust a strain, for example, a compressive strain or a tensile strain, caused by the STI structures 1900.

Therefore, in some embodiments, the STI structures 1900 may not only isolate the strained GeOI structure from other devices, but also apply a stress to the channel region so as to produce the strain in the channel region, thus improving a performance of a device.

In one embodiment, the strained GeOI structure further comprises a second passivation layer 1500 formed on the Ge layer 1300. Similarly, in some embodiments, the second passivation layer 1500 is a strontium germanide layer or a barium germanide layer formed by treating a second surface of the Ge layer 1300 using strontium or barium. In other embodiments, the second passivation layer 1500 may also be formed by other methods, that is, the second passivation layer 1500 is a stannum germanide layer.

In one embodiment, the strained GeOI structure further comprises a gate dielectric layer 1600 formed on the second passivation layer 1500, a gate electrode 1700 formed on the gate dielectric layer 1600, and a source 1800 and a drain 1800 formed in the Ge layer 1300.

Figure 2:
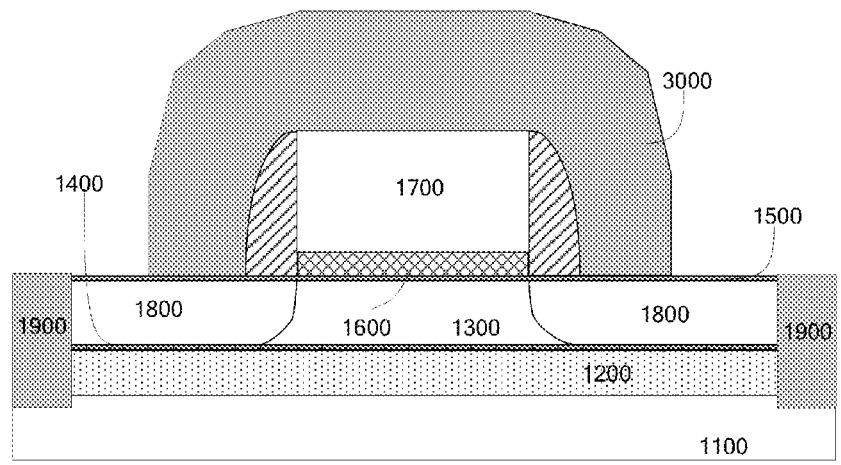
FIG. 2 is a cross-sectional view of a strained GeOI structure according to another embodiment of the present disclosure.

FIG. 2 is a cross-sectional view of a strained GeOI structure according to another embodiment of the present disclosure. In this embodiment, the strained GeOI structure further comprises a SiN stress cap layer 3000 covering a gate stack (comprising the gate dielectric layer 1600 and the gate electrode 1700) to produce a strain in the channel region. In one embodiment, a content of N in the STI structures 1900 and the SiN stress cap layer 3000 may be adjusted to produce a tensile strain in the channel region.

In one embodiment, the source 1800 and the drain 1800 are a $Si_xGe_{1-x}$:C source and a $Si_xGe_{1-x}$:C drain respectively to produce a corresponding strain in the channel region, in which x is within a range from 0 to 1 and a content of C is within a range from 0 to 7.5%. Generally, the $Si_xGe_{1-x}$:C source and the $Si_xGe_{1-x}$:C drain may cause a tensile strain to be produced in the channel region. At this time, in order to prevent a strain caused by the $Si_xGe_{1-x}$:C source and the $Si_xGe_{1-x}$:C drain and a strain caused by the STI structures 1900 and the SiN stress cap layer 3000 from conflicting with each other, a content of N in the STI structures 1900 and the SiN stress cap layer 3000 may need to be adjusted to produce a tensile strain in the channel region.

FIGS. 3-8 are cross-sectional diagrams of intermediate statuses of a strained GeOI structure formed during a process of a method for forming the strained GeOI structure according to an embodiment of the present disclosure. The method comprises the following steps.

Step S101, a substrate 2000 is provided. In some embodiments, the substrate 2000 is a Si substrate or a Ge substrate. In other embodiments, other substrates may also be used. In some embodiments, the substrate 2000 may be reused, thus reducing a fabrication cost.

Figure 3:
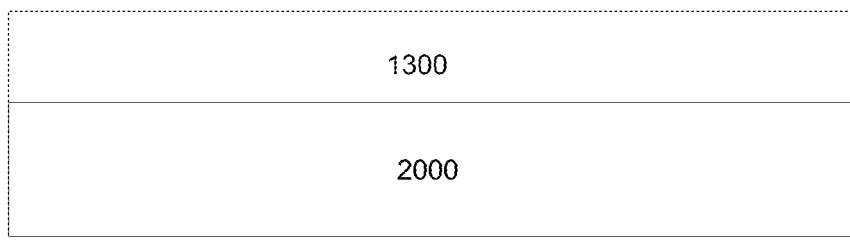
FIGS. 3-8 are cross-sectional diagrams of intermediate statuses of a strained GeOI structure formed during a process of a method for forming the strained GeOI structure according to an embodiment of the present disclosure.

Step S102, a Ge layer 1300 is formed on the substrate 2000, as shown in FIG. 3.

Figure 4:
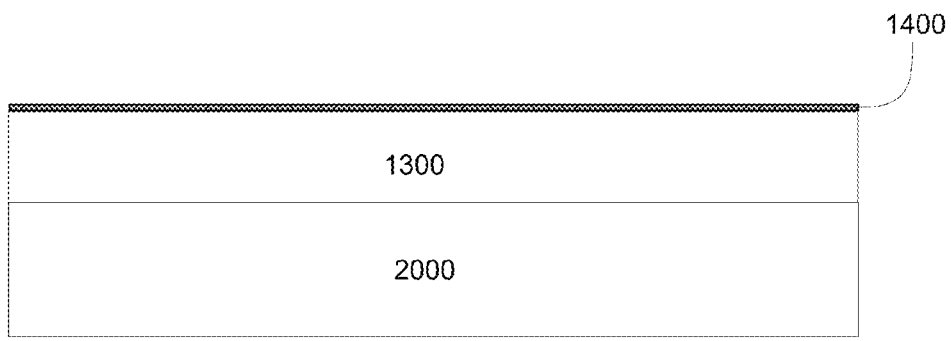

Step S103, a first surface of the Ge layer 1300 is treated using strontium or barium to form a first passivation layer 1400, and the first passivation layer 1400 is a strontium germanide layer or a barium germanide layer, as shown in FIG. 4. In other embodiments, the first passivation layer 1400 may also be a stannum germanide layer.

Figure 5:
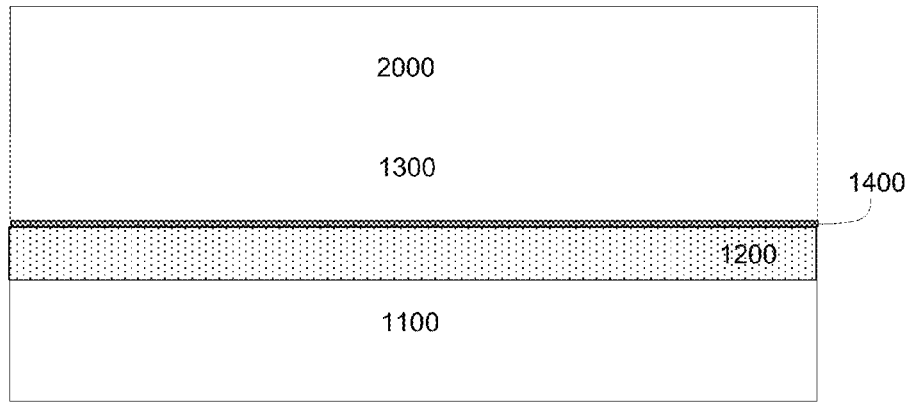

Step S104, the first passivation layer 1400 is connected with a silicon substrate 1100, on a surface of which an oxide insulating layer 1200 is formed, as shown in FIG. 5. In one embodiment, the first passivation layer 1400 is bonded with the oxide insulating layer 1200.

Figure 6:
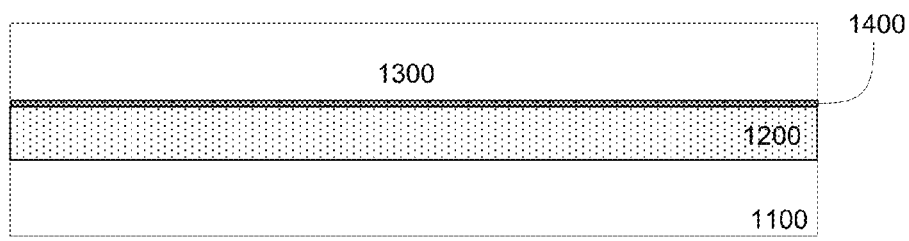

Step S105, the substrate 2000 is removed, as shown in FIG. 6.

Figure 7:
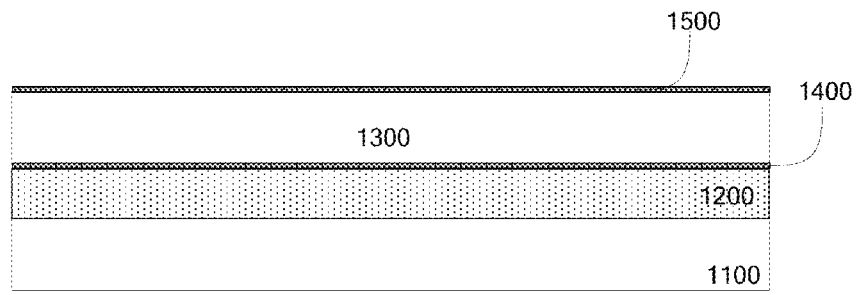

Step S106, alternatively, a second surface of the Ge layer 1300 is treated using strontium or barium to form a second passivation layer 1500, and the second passivation layer 1500 is a strontium germanide layer or a barium germanide layer, as shown in FIG. 7. Similarly, in other embodiments, the second passivation layer 1500 may also be formed by other methods, that is, the second passivation layer 1500 is a stannum germanide layer.

Step S107, a gate stack (comprising a gate dielectric layer 1600 and a gate electrode 1700) is formed on the second passivation layer 1500, a side wall is formed on sides of the gate stack, a channel region is formed below the gate stack, and a source 1800 and a drain 1800 are formed on sides of the channel region respectively. In one embodiment, the gate stack, and the source 1800 and the drain 1800 may be formed by a gate-first technique or a gate-last technique.

Figure 8:
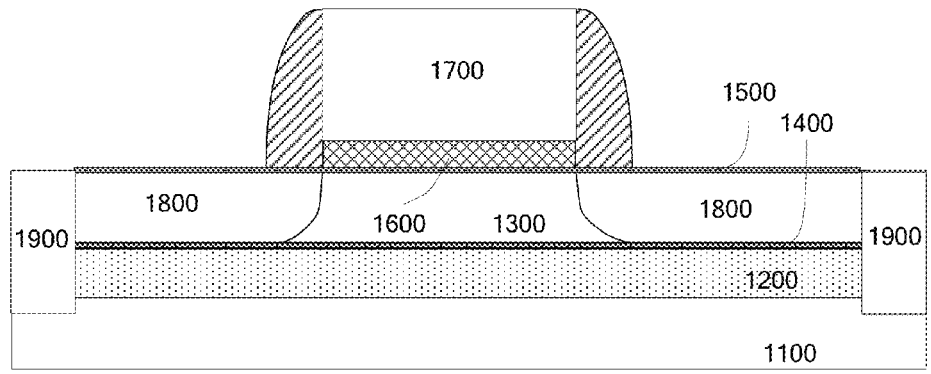

Step S108, the second passivation layer 1500, the Ge layer 1300, the first passivation layer 1400 and the oxide insulating layer 1200 are etched to form a plurality of STI structures 1900, and the plurality of STI structures 1900 extend into the silicon substrate 1100, as shown in FIG. 8.

Step S109, the STI structures 1900 are filled with an insulating dielectric material, for example, silicon nitride, to produce a strain in the channel region, as shown in FIG. 1.

In one embodiment, the source 1800 and the drain 1800 are doped to form a $Si_xGe_{1-x}$:C source and a $Si_xGe_{1-x}$:C drain respectively so as to produce a corresponding strain in the channel region, in which x is within a range from 0 to 1 and a content of C is within a range from 0 to 7.5%.

In one embodiment, the method further comprises: forming a SiN stress cap layer 3000 covering the gate stack to produce a strain in the channel region, as shown in FIG. 2.

According to an embodiment of the present disclosure, the first passivation layer may alleviate an interface state problem between Ge materials and an insulation oxide, thus reducing a leakage and a carrier scattering at the interface. Moreover, because the strontium germanide layer, the barium germanide layer or the stannum germanide layer is a semiconductor layer, the interface state problem between Ge materials and the insulation oxide may be alleviated so as to reduce the leakage and the carrier scattering at the interface, and the carrier mobility of the Ge materials may not be reduced largely. In addition, the plurality of STI structures filled with the insulating dielectric material may cause a desired strain to be produce in the channel region below the gate stack, thus further improving the performance of the device.

Furthermore, the SiN stress cap layer may cause a strain to be produced in the channel region, thus improving the performance of the device. When the side walls are 0.5-0.8 times as high as the gate electrode, a stress in the SiN stress cap layer may be transferred to the channel region effectively, thus further improving the performance of the device.

Moreover, according to an embodiment of the present disclosure, the Ge channel device comprising the $Si_xGe_{1-x}$:C source and the $Si_xGe_{1-x}$:C drain may be simple in structure and easy to form, and a diffusion of impurities (for example, B or P) in the $Si_xGe_{1-x}$:C source and the $Si_xGe_{1-x}$:C drain may be much weaker than that in the Ge layer, thus obtaining high doping concentrations in the $Si_xGe_{1-x}$:C source and the $Si_xGe_{1-x}$:C drain and improving the performance of the device. In addition, the $Si_xGe_{1-x}$:C source and the $Si_xGe_{1-x}$:C drain may cause a tensile strain to be produced in the channel region, thus improving the performance of the Ge channel device.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A strained Ge-on-insulator structure, comprising:
   a silicon substrate, wherein an oxide insulating layer is formed on a surface of the silicon substrate;
   a Ge layer formed on the oxide insulating layer, wherein a first passivation layer is directly formed on the oxide insulating layer, the Ge layer is directly formed on the first passivation layer, and the first passivation layer is a strontium germanide layer, a barium germanide layer, or a stannum germanide layer;
   a gate stack formed on the Ge layer, a channel region formed below the gate stack, and a source and a drain formed on sides of the channel region; and
   a plurality of shallow trench isolation structures extending into the silicon substrate and filled with an insulating dielectric material to produce a strain in the channel region.

2. The strained Ge-on-insulator structure according to claim 1, further comprising:
   a second passivation layer formed on the Ge layer,
   wherein the second passivation layer is a strontium germanide layer, a barium germanide layer, or a stannum germanide layer.

3. The strained Ge-on-insulator structure according to claim 1, further comprising:
   a second passivation layer formed on the Ge layer,
   wherein the second passivation layer is a $Si_yGe_{1-y}$ layer, in which y is within a range from 0 to 1.

4. The strained Ge-on-insulator structure according to claim 1, wherein the insulating dielectric material is silicon nitride.

5. The strained Ge-on-insulator structure according to claim 1, further comprising:
   a SiN stress cap layer covering the gate stack to produce a strain in the channel region.

6. The strained Ge-on-insulator structure according to claim 1, wherein the source and the drain are a $Si_xGe_{1-x}$:C source and a $Si_xGe_{1-x}$:C drain respectively 5 to produce a corresponding strain in the channel region, in which x is within a range from 0 to 1 and a content of C is within a range from 0 to 7.5%.

* * * * *